(12) United States Patent
Cok

(10) Patent No.: US 7,288,753 B2
(45) Date of Patent: Oct. 30, 2007

(54) OLED DISPLAY WITH COMPOSITE PHOTOSENSOR

(75) Inventor: Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 262 days.

(21) Appl. No.: 10/839,616

(22) Filed: May 5, 2004

(65) Prior Publication Data

US 2005/0248264 A1    Nov. 10, 2005

(51) Int. Cl.
*G01J 1/44*   (2006.01)
*G09G 3/30*   (2006.01)

(52) U.S. Cl. ........................ 250/214 R; 345/81; 257/80

(58) Field of Classification Search ............ 250/208.1, 250/214 R; 345/80–84, 207; 257/80–84
See application file for complete search history.

(56) References Cited

U.S. PATENT DOCUMENTS

| | | | |
|---|---|---|---|
| 4,029,415 A * | 6/1977 | Johnson | 356/4.08 |
| 5,371,537 A | 12/1994 | Bohan et al. | 348/181 |
| 5,663,555 A * | 9/1997 | Miyawaki et al. | 250/208.1 |
| 6,320,325 B1 | 11/2001 | Cok et al. | 315/169.3 |
| 6,489,631 B2 * | 12/2002 | Young et al. | 257/59 |
| 6,509,574 B2 | 1/2003 | Yuan et al. | 250/551 |
| 2001/0013758 A1 | 8/2001 | Tsuruoka et al. | 315/169.3 |
| 2001/0052597 A1 | 12/2001 | Young et al. | 257/59 |
| 2001/0055008 A1 | 12/2001 | Young et al. | 345/204 |
| 2002/0027206 A1 | 3/2002 | Yuan et al. | 250/551 |
| 2003/0053044 A1 | 3/2003 | Popovic et al. | 356/218 |
| 2004/0031965 A1 | 2/2004 | Forrest et al. | 257/79 |
| 2004/0257354 A1 | 12/2004 | Naugler et al. | 345/204 |

FOREIGN PATENT DOCUMENTS

| | | |
|---|---|---|
| EP | 1 467 408 | 10/2004 |
| WO | WO 03/038798 | 5/2003 |

* cited by examiner

*Primary Examiner*—Thanh X. Luu
(74) *Attorney, Agent, or Firm*—Andrew J. Anderson; Stephen H. Shaw

(57) ABSTRACT

An OLED display and photo-sensor is described, comprising: a substrate; a composite light sensor made up of a plurality of individual thin-film light sensitive elements located over the substrate and connected in parallel to provide a common signal; a first transparent electrode located over the composite light sensor; one or more organic layers comprising an OLED located on the transparent electrode and emitting light through the transparent electrode and to the composite light sensor; and a second electrode located on the one or more organic layers comprising an OLED. The OLED display device provides a means to measure the light output of the OLED display device while maximizing the light output and is useful in measuring incident ambient illumination.

25 Claims, 6 Drawing Sheets

OLED DISPLAY WITH COMPOSITE PHOTOSENSOR

FIELD OF THE INVENTION

The present invention relates to solid-state OLED flat-panel displays and, more particularly, to such displays having photosensors integrated into the display.

BACKGROUND OF THE INVENTION

Solid-state organic light emitting diode (OLED) image displays are of great interest as a superior flat-panel display technology. These displays utilize current passing through thin films of organic material to generate light. The color of light emitted and the efficiency of the energy conversion from current to light are determined by the composition of the organic thin-film material. Different organic materials emit different colors of light. However, as the display is used, the organic materials in the device age and become less efficient at emitting light. It is useful, therefore, to provide a means to correct the light output of an OLED device over time. It is also useful to detect the ambient illumination incident on an OLED display and to modify the brightness of the OLED display in response to the ambient illumination.

OLED devices are conventionally either top-emitting or bottom-emitting. An OLED display is constructed upon a substrate by depositing an electrode upon the substrate, organic light emitting materials over the first electrode, and a second electrode above the light emitting materials. A cover is used to encapsulate and protect the device. Light is emitted by the application of a current from one electrode to another passing through the organic light emitting materials. A bottom emitting device emits light through the substrate and first electrode which must both be transparent. The second electrode in a bottom emitting device may be either transparent or reflective. A top-emitting device emits light through the cover and second electrode which must both be transparent. The first electrode in a top-emitting device may be either transparent or reflective.

OLEDs emit light in every direction. A portion of the light is emitted directly toward the front of the display device: through the substrate (for a bottom-emitter device) or the encapsulating cover (for a top-emitter device). A similar portion of the light is emitted toward the back of the display device and may be either absorbed or reflected by the electrode or other layers behind the organic layers. If the portion of light emitted toward the back is reflected, it can pass through the organic layers again and be emitted through the front of the display, thereby increasing the brightness of the display. If the portion of the light emitted toward the back is absorbed, it is absorbed and lost, thereby reducing the light emitted by one half.

Because OLED materials age, it is known to calibrate OLED display devices through the use of external sensors which measure the light output from the display device and construct a calibration table for use by the device to correct for aging. See for example U.S. Pat. No. 5,371,537, issued Dec. 6, 1994 to Bohan et al. This approach has the problem that the sensor device obscures the display during the calibration and is not capable of providing real time operation. Moreover, these approaches are not useful for correcting uniformity variations among individual pixel display elements.

Alternative methods utilize a light sensor integrated with the light emitting elements of the display themselves. For example, U.S. Pat. No. 6,489,631, Dec. 3, 2002, entitled "Light-Emitting Matrix Array Display Devices with Light Sensing Elements" describes the integration of a photosensitive device with an electro-luminescent pixel element. The light sensing elements each comprise a gated photosensitive thin-film device such as a TFT structure having a semiconductor layer with contact regions laterally spaced on the substrate and separated by a gate controlled region. A part of the associated display element extends over the gate controlled region with an electrode of the display element serving as the gate of the photosensitive device, thereby ensuring good optical coupling between the display element and the photosensitive device. This arrangement fails to provide adequate sensitivity for sensing ambient illumination in an actual device and does not provide feed-back on the OLED light output uniformity.

There is a need therefore for an improved OLED display having integrated photosensors.

SUMMARY OF THE INVENTION

In accordance with one embodiment, the invention is directed towards an OLED display and photo-sensor, comprising: a substrate; a composite light sensor made up of a plurality of individual thin-film light sensitive elements located over the substrate and connected in parallel to provide a common signal; a first transparent electrode located over the composite light sensor; one or more organic layers comprising an OLED located on the transparent electrode and emitting light through the transparent electrode and to the composite light sensor; and a second electrode located on the one or more organic layers comprising an OLED.

ADVANTAGES

The advantages of this invention are an OLED display device that provides a means to measure the light output of the OLED display device while maximizing the light output and is useful in measuring incident ambient illumination.

DETAILED DESCRIPTION OF THE INVENTION

Figure 1:
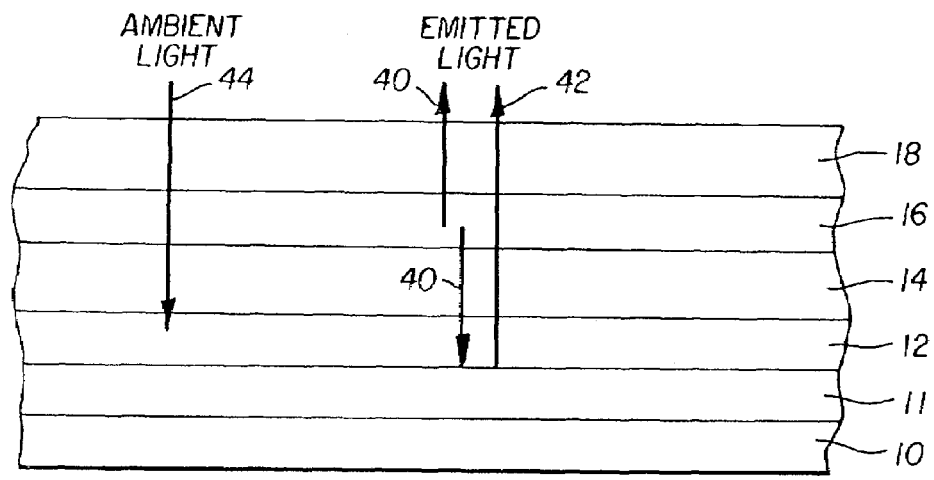
FIG. 1 is a cross sectional schematic diagram of a light emitting OLED and photo-sensors in an OLED display according to an embodiment of the present invention.

Referring to FIG. 1, a top-emitter OLED display and photo-sensor, comprises a substrate 10; a composite light sensor layer 12 located over the substrate comprising a plurality of thin-film light sensitive elements connected in parallel; a first transparent electrode 14 located over the plurality of thin-film light sensitive elements; one or more organic layers 16 comprising an OLED located on the transparent electrode 14 and emitting light through the transparent electrode 14; and a second electrode 18 located on the one or more organic layers 16 comprising an OLED. An additional reflective layer 11 may be provided above the substrate beneath the plurality of light sensitive elements in layer 12. In the top-emitter configuration shown in FIG. 1, the second electrode 18 must also be transparent. A planarizing layer, not shown, may be employed between the composite light sensor layer 12 and the transparent electrode 14.

Figure 2:
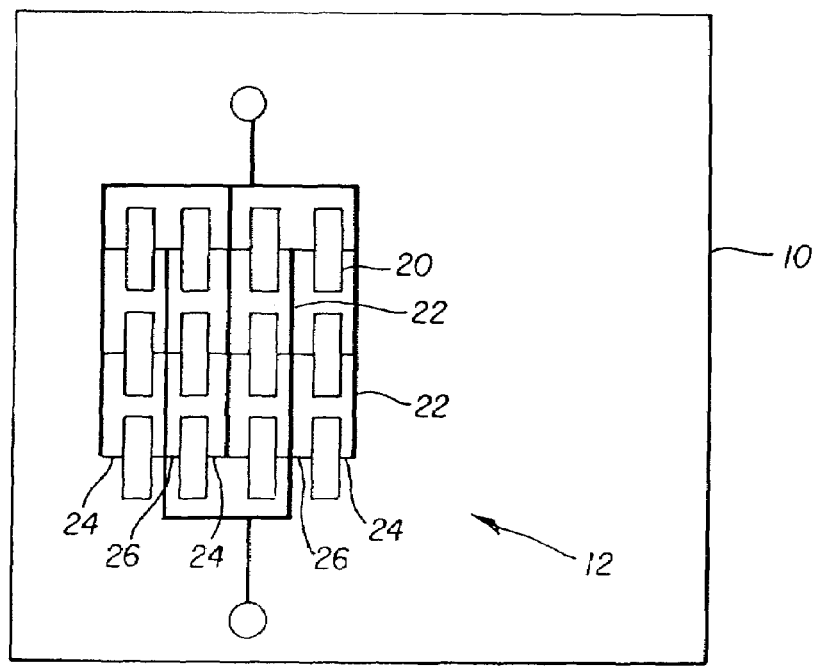
FIG. 2 is a schematic diagram of a portion of a composite light sensor according to one embodiment of the present invention.

Referring to FIG. 2, in a top view, composite light sensor layer 12 is depicted in more detail in accordance with a particular embodiment, with each thin-film light sensitive element 20 of the plurality of thin-film light sensitive elements connected in parallel with connections 22. As shown in FIG. 2, each light sensitive element has two terminal contacts 24 and 26. Contacts 24 and 26 are connected in parallel for each of the light sensitive elements 20 in layer 12.

Figure 3:
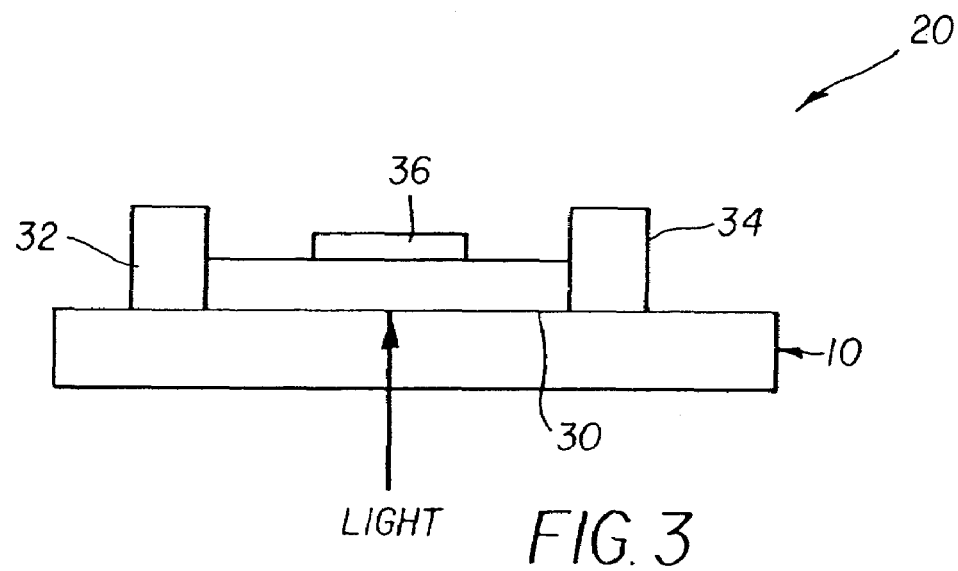
FIG. 3 is a schematic diagram of a light sensitive element structure useful in the present invention.

Referring to FIG. 3, a three-terminal light sensitive element includes a photo-transistor having a source terminal 32, gate terminal 36, and drain terminal 34 connected to a semiconductor 30 located on the substrate 10 is shown. In FIG. 3, gate terminal 36 is located above semiconductor 30 (relative to substrate 10). In an alternative embodiment shown in FIG. 4, the gate terminal 36 is located beneath the semiconductor 30 (relative to substrate 10). When connected as shown in FIG. 2, contacts 24 may be connected to the source terminal 32 of the three-terminal light sensitive element while the contacts 26 may be connected to the drain 34. The gates 36 are also connected in parallel (not shown) and may, or may not, be connected to an external connection.

Figure 5:
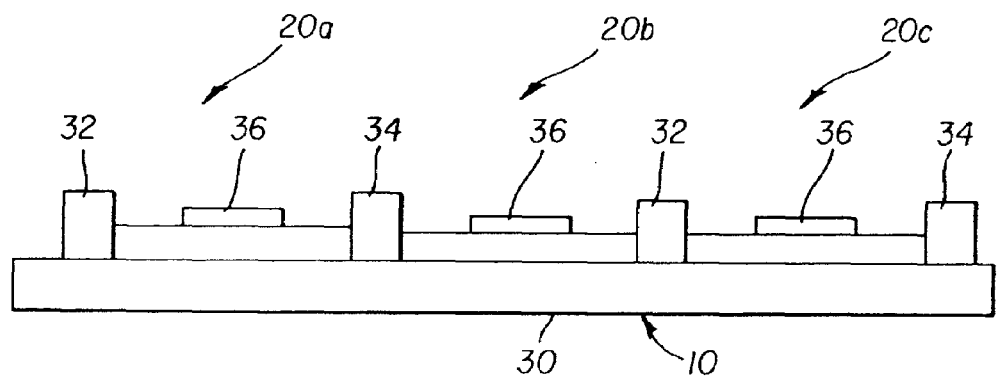
FIG. 5 is a schematic diagram of a structure having a plurality of light sensitive elements useful in the present invention.

Referring to FIG. 5, a light sensitive element may share terminals with other light sensitive elements in the array, thereby reducing the area required to construct the light sensitive elements and packing them more densely on the substrate 10. In FIG. 5, the light sensitive element 20a shares a drain terminal 34 with light sensitive element 20b. Light sensitive element 20b also shares a source terminal 32 with light sensitive element 20c. The terminals 32, 34, and 36 are all connected in parallel (not shown).

Figure 6:
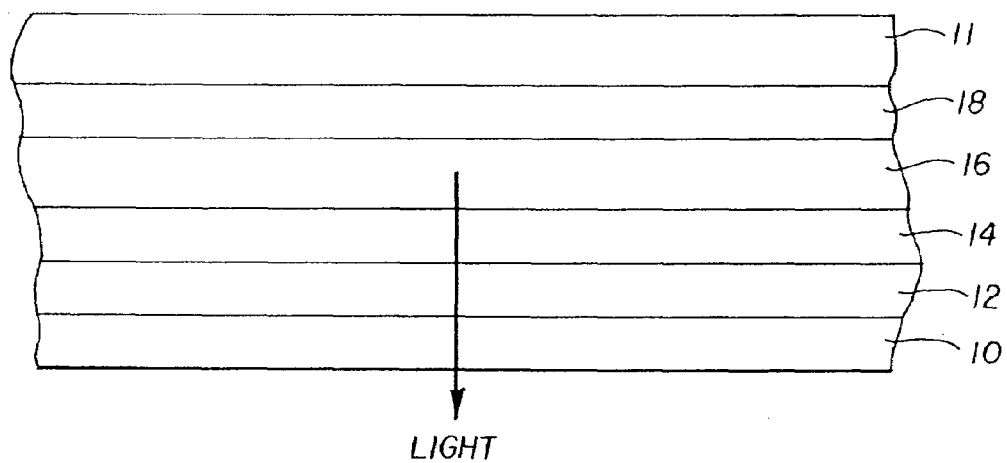
FIG. 6 is a cross sectional schematic diagram of a light emitting OLED and composite light sensor layer in an OLED display according to an alternative embodiment of the present invention.

Referring to FIG. 6, a bottom-emitter OLED display and photo-sensor, comprises a substrate 10; a composite light sensor layer 12 located over the substrate comprising a plurality of thin-film light sensitive elements connected in parallel; a first transparent electrode 14 located over the plurality of thin-film light sensitive elements; one or more organic layers 16 comprising an OLED located on the transparent electrode and emitting light through the transparent electrode; and a second electrode 18 located on the one or more organic layers 16 comprising an OLED. An additional reflective layer 11 may be provided above the second electrode 18. A planarizing layer, not shown, may be employed between the composite light sensor layer 12 and the transparent electrode 14.

In the bottom-emitter configuration shown in FIG. 6, the second electrode 18 need not be transparent since the light emitted by the organic layers 16 is emitted through the substrate. In a preferred embodiment, the electrode 18 may itself be reflective (e.g., where electrode 18 comprises a metal), so as to re-direct the OLED light emitted toward the electrode 18 through the substrate 10. Alternatively, an additional reflective layer 11 may be employed to redirect any light that passes through electrode 18.

Referring back to FIG. 1, in operation, current is supplied to electrodes 14 and 18 causing the OLED layers 16 to emit light 40. Because OLED devices emit light in every direction, some of the light will be emitted through the transparent electrode 18 and some will be emitted toward the substrate 10. The light emitted toward the substrate 10 passes through the light sensitive elements in layer 12 and produces a current in the light sensitive elements in proportion to the intensity of the light emitted by the OLED layers. The light may then be reflected 42 from the reflective layer 11, pass through the light sensitive elements again and then be emitted from the OLED device. The presence of the reflective layer 11 provides two benefits. First, a greater proportion of the light from the OLED layers is emitted from the display. Second, the light sensitive elements in layer 12 will respond to twice as much light, thereby increasing the amount of current produced and improving the sensitivity of the composite light sensor. A measurement of this current may then be used to calculate the intensity of the light emitted by the OLED.

The composite light sensor in layer 12 is also responsive to ambient illumination. In this case, ambient light 44 is incident on the OLED display. The light travels through the transparent electrodes and OLED layers and is absorbed by the light sensitive elements, producing a signal in proportion to the intensity of the incident illumination. The ambient light may also be reflected from the reflective layer, pass through the light sensitive elements again, producing an increased response signal in the composite light sensor, and pass back out of the device.

Generally, for OLED display devices, it is preferred that ambient light be absorbed in a display, thereby improving the contrast of the display. Hence, an absorptive layer may be employed in the place of the reflective layer to improve the contrast of the display. However, this reduces the light emitted by the OLEDs in the display and the composite light sensor signal. For OLED devices for which contrast is not a concern, a reflective layer is preferred. For example, other contrast-enhancing means, such as circular polarizers (not shown) are often provided in an OLED display.

Figure 4:
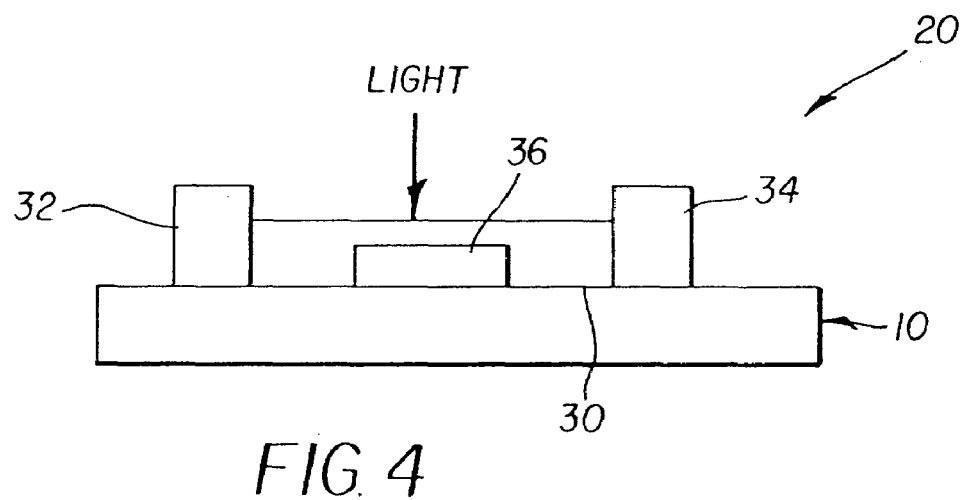
FIG. 4 is a schematic diagram of an alternative light sensitive element structure useful in the present invention.

For a three-terminal device such as that shown in FIGS. 3 and 4, the location of the gate may have a significant impact on the sensitivity of the light sensitive element. In a preferred embodiment, the gate is located on the substrate side of the light sensitive element (i.e., beneath the semiconductor 30 as shown in FIG. 4) for a top-emitter OLED device. In this configuration, the light from either the OLED or the ambient light first passes through the semiconductor 30 before striking the gate 36. Hence, the gate 36 does not shadow the semiconductor 30. The preferred direction of the light in these configurations is illustrated with the arrow. However, the composite light sensor will work in either configuration.

Figure 8:
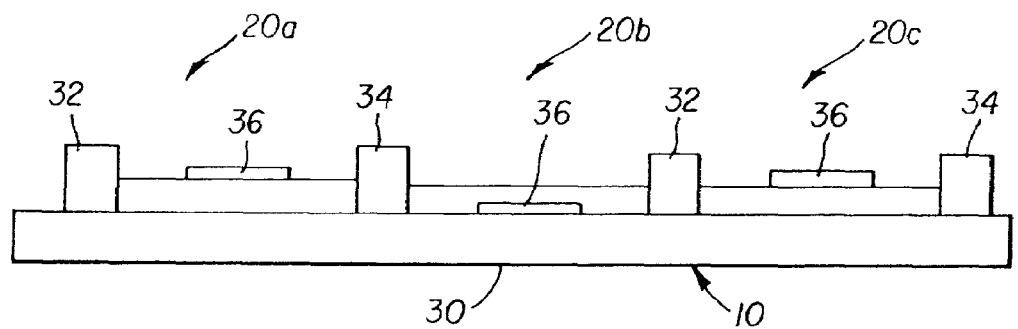
FIG. 8 is a schematic diagram of an alternative structure having a plurality of light sensitive elements useful in the present invention.

A bottom-emitter OLED configuration is more complex. If the gate 36 of a three-terminal light sensitive element is located on the substrate side of the light sensitive element, the light sensitive element will be most responsive to light coming from the OLEDs. However, ambient light incident on the display will then be shadowed by the gate 36. Alternatively, if the gate 36 of a three-terminal light sensitive element is located on side of the light sensitive element opposite the substrate 10 (i.e., above the semiconductor 30 as shown in FIG. 3), the light sensitive element will be most responsive to ambient light and will shadow light coming from the OLED emitting, layers 24. This problem may be ameliorated to some extent by providing some of the plurality of the three-terminal light sensitive elements with gates on the substrate side and some with gates on the opposing sides, for example as shown in FIG. 8.

It has also been determined that the photo-sensitivity of the thin-film light sensitive elements is primarily restricted to the junctions between doping areas of the semiconductor 30 in the light sensitive element. Hence, to increase the current response of a light sensitive element, the size of the junction should be made as large as possible. Simply increasing the overall size of an individual light sensitive element, however, may or may not significantly increase the junction size. Providing a plurality of light sensitive elements connected in parallel in accordance with the invention will increase the aggregate number of junctions relative to a single large light sensitive element within a given area, and more effectively enable increasing the cumulative junction size, and therefore the photo-sensitivity, of the light sensitive elements in the area.

Figure 7:
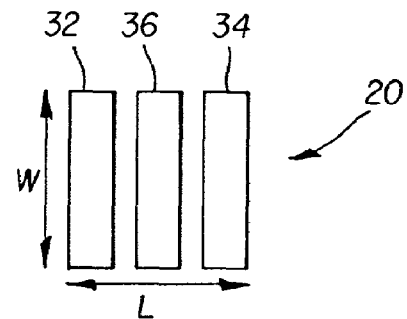
FIG. 7 is a top view schematic diagram of a light sensitive element structure useful in the present invention.

According to the present invention, the cumulative semiconductor doped junction size is preferably made as large as possible by providing a plurality of light sensitive elements whose distance between terminals is as small as possible and whose doped junctions are as long as possible. Within a single light sensitive element, simply increasing the length of a light sensitive element (i.e., distance between terminals) will not provide increase the junction size, and therefore will not improved response. The junction size can be increased, and improved response can be obtained, however, by elongating the junction. This increases the width of the light sensitive element, as opposed to its length. Therefore, in a preferred embodiment, each of the individual light sensitive elements which are connected in parallel preferably comprises two or more relatively elongated terminals that are approximately parallel in the direction of elongation, where the lengths of the elongated terminals are greater than a distance between the elongated terminals. Referring to FIG. 7, e.g., for a three-terminal device, the elongation W of the terminals should be made as large as practicable with respect to the light sensitive element length L.

In an efficient manufacturing process having high yields, it is important to minimize the variety and number of steps. Hence, it is an advantage of the present invention that the light sensitive elements can be made of, for example, photo-transistors that use similar materials and structures as other electronic components found in active-matrix OLED displays.

The OLED display and photo-sensors of the present invention may be employed to provide information on the brightness of an OLED emitter or the ambient illumination incident on the display. A separate composite light sensor (i.e., plurality of light sensitive elements connected in parallel) may be provided for each of a plurality of OLED emitters in a display or alternatively, a single OLED emitter and composite light sensor may be provided. In any case, the light sensitive elements may have a variable response and the OLED emitters may have a variable output depending on manufacturing variability. These variations can be accommodated by first exposing the plurality of light sensitive elements to a known ambient illumination. The response of the light sensitive elements to the known illumination can be used to calibrate the composite light sensors. The OLED emitter(s) may then be turned on and the light emitted measured by the composite light sensor. This measurement can be used to calibrate the OLED emitter(s). Once both the composite light sensor and the OLED emitters have been calibrated, the performance of the OLED emitters can be monitored over time and corrected as necessary.

Figure 9:
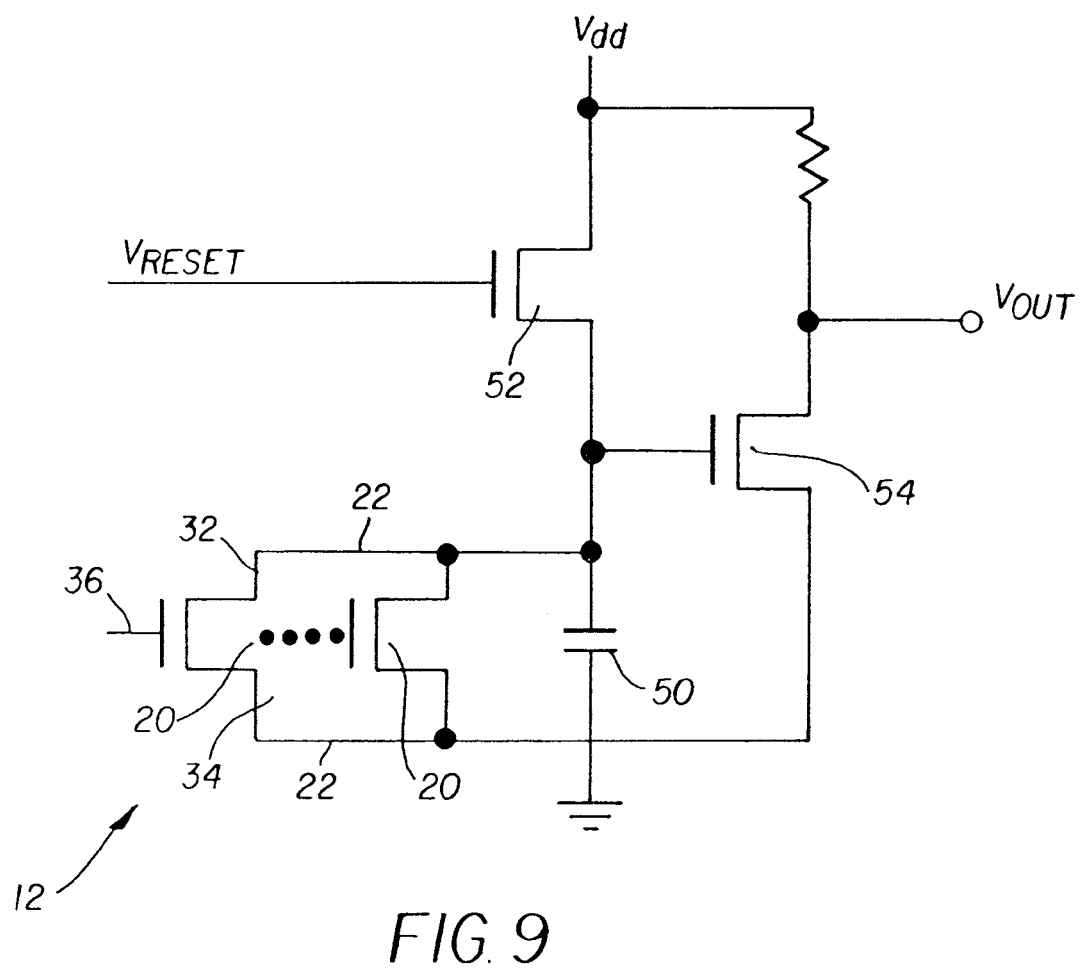
FIG. 9 is a schematic diagram of a circuit useful in the present invention.
Figure 10:
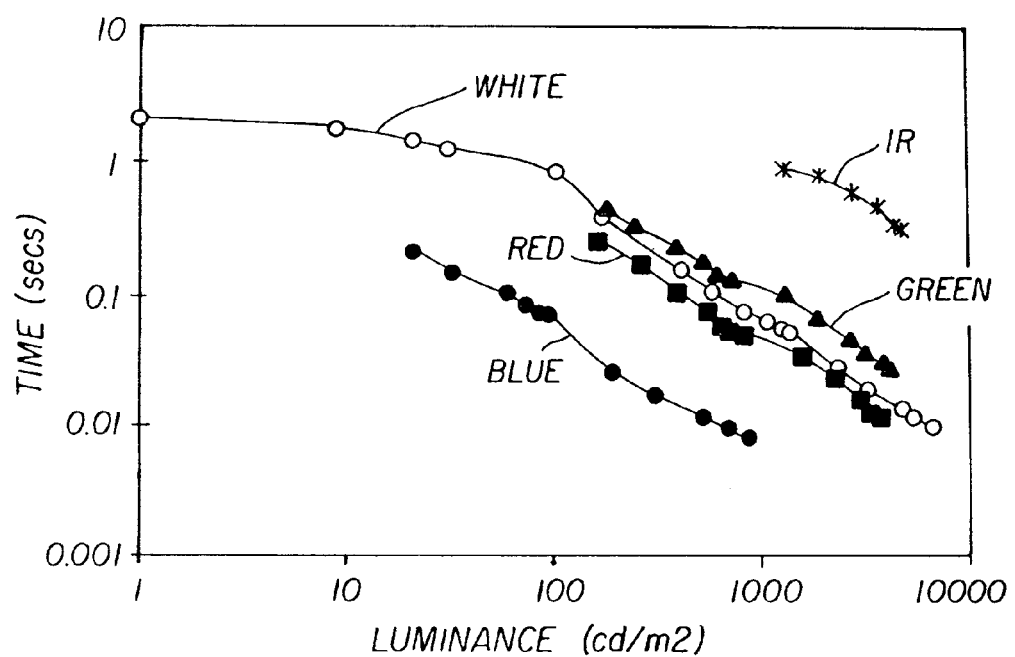
FIG. 10 is a graph illustrating the response to light of a composite light sensor and a circuit according to an embodiment of the present invention.

In actual use, the OLED display and photo-sensors of the present invention may be used for both OLED output correction and ambient compensation. Once the OLED emitter(s) and composite light sensor(s) are calibrated, the ambient illumination incident on the display device may be measured alone by turning off the OLED emitter. This measurement may be employed to increase or decrease the brightness of the OLED display. Once the ambient illumination is measured, the OLED display can be used. Further measurements by the composite light sensors record the brightness of the display and the ambient illumination together. By subtracting the ambient illumination signal measured earlier from the combined signal measurement, the light emitted by the OLED emitters can be determined and the performance of the OLED display determined. Suitable measurement circuitry is illustrated in FIG. 9. Referring to FIG. 9, a plurality of individual light sensitive elements 20 (the plurality indicated by the repeated dots) having terminals 32, 34, and 36 are connected in parallel with connections 22. The terminals are connected to a circuit having a capacitor 50, reset transistor 52 and transistor amplifier 54. Applicants have employed the thin-film circuit of FIG. 9 (with 100 light sensitive elements connected in parallel, each individual light sensitive element 20 and transistors 52 and 54 of size six-by-twenty microns and constructed in common manufacturing steps) to measure incident light over a wide variety of intensities and for a wide variety sources, including OLED sources and ambient illumination for a variety of colors. FIG. 10 illustrates the response for red, green, blue, white, and infrared light.

In a preferred embodiment, the invention is employed in a device that includes Organic Light Emitting Diodes (OLEDs) which are composed of small molecule or polymeric OLEDs as disclosed in but not limited to U.S. Pat. No. 4,769,292, issued Sep. 6, 1988 to Tang et al., and U.S. Pat. No. 5,061,569, issued Oct. 29, 1991 to VanSlyke et al. Many combinations and variations of organic light emitting displays can be used to fabricate such a device.

The invention has been described in detail with particular reference to certain preferred embodiments thereof, but it will be understood that variations and modifications can be effected within the spirit and scope of the invention.

PARTS LIST

10 substrate
11 reflector
12 composite light sensor layer
14 first transparent electrode
16 OLED layers
18 second electrode
20, 20*a*, 20*b*, 20*c* light sensitive element
22 connector
24 terminal contact
26 terminal contact
30 semiconductor 32 source terminal
34 drain terminal
36 gate terminal
40 emitted light
42 reflected light
44 ambient light
50 capacitor
52 reset transistor
54 amplifier transistor

What is claimed is:

1. An OLED display and photo-sensor, comprising:
   a) a substrate;
   b) a composite light sensor made up of a plurality of individual thin-film light sensitive elements located over the substrate and connected in parallel with electrical connections to provide a common signal:
   C) a first transparent electrode located over the composite light sensor;
   d) one or more organic layers comprising an OLED located on the transparent electrode and emitting light through the transparent electrode and to the composite light sensor; and
   e) a second transparent electrode located on the one or more organic layers comprising an OLED, wherein the OLED display is a top-emitter OLED display.

2. The OLED display and photo-sensor claimed in claim 1, wherein the individual thin-film light sensitive elements comprise photo-transistors.

3. The OLED display and photo-sensor claimed in claim 1, wherein composite light sensor comprises thin film light sensitive elements having two or more relatively elongated terminals that are approximately parallel in the direction of elongation, where the lengths of the elongated terminals are greater than a distance between the elongated terminals.

4. The OLED display and photo-sensor claimed in claim 1, further comprising a planarizing layer between the composite light sensor and the first transparent electrode.

5. The OLED display and photo-sensor claimed in claim 1, further comprising a reflective layer located over the substrate, wherein the composite light sensor is located between the reflective layer and the first transparent electrode.

6. The OLED display and photo-sensor claimed in claim 1, wherein each of the thin film light sensitive elements includes a terminal located on the bottom side of the light sensitive element.

7. The OLED display and photo-sensor claimed in claim 1, wherein each of the light sensitive elements includes at least two terminals, and adjacent light sensitive elements in a composite light sensor share a terminal.

8. The OLED display and photo-sensor claimed in claim 1, further comprising circuitry for measuring the ambient illumination incident on the composite light sensor and the light output by the OLED.

9. The OLED display and photo-sensor claimed in claim 1, wherein the OLED display is an active-matrix display and further including thin-him electronic components for operating the OLEDs in the display.

10. The OLED display and photo-sensor claimed in claim 9, wherein the plurality of thin-film light sensitive elements are formed in common manufacturing steps with the thin-film electronic components.

11. An OLED display and photo-sensor, comprising:
    a) a substrate;
    b) a composite light sensor made up of a plurality of individual thin-film light sensitive elements located over the substrate and connected in parallel with electrical connections to provide a common signal;
    C) a first transparent electrode located over the composite light sensor;
    d) one or more organic layers comprising an OLED located on the transparent electrode and emitting light through the transparent electrode and to the composite light sensor; and
    e) a second electrode located on the one or more organic layers comprising an OLED;
    f) a reflective layer located over the second electrode, wherein the OLED display is a bottom-emitter OLED display.

12. The OLED display and photo-sensor claimed in claim 11, wherein the individual thin-film light sensitive elements comprise photo-transistors.

13. The OLED display and photo-sensor claimed in claim 11, wherein composite light sensor comprises thin film light sensitive elements having two or more relatively elongated terminals that are approximately parallel in the direction of elongation, where the lengths of the elongated terminals are greater than a distance between the elongated terminals.

14. The OLED display and photo-sensor claimed in claim 11, further comprising a planarizing layer between the composite light sensor and the first transparent electrode.

15. The OLED display and photo-sensor claimed in claim 11, wherein each of the thin film light sensitive elements includes a terminal located on the bottom side of the light sensitive element.

16. The OLED display and photo-sensor claimed in claim 11, wherein each of the thin film light sensitive elements includes a terminal located on the top side of the light sensitive element.

17. The OLED display and photo-sensor claimed in claim 11, wherein each of the thin film light sensitive elements includes a terminal and the terminal is located on the bottom side of some of the light sensitive elements, and the terminal is located on the top side of some of the light sensitive elements.

18. The OLED display and photo-sensor claimed in claim 17, wherein the light sensitive elements including a terminal located on the bottom side alternate with the light sensitive elements including a terminal located on the top side.

19. The OLED display and photo-sensor claimed in claim 11, wherein each of the light sensitive elements includes at least two terminals, and adjacent light sensitive elements in a composite light sensor share a terminal.

20. The OLED display and photo-sensor claimed in claim 11, further comprising circuitry for measuring the ambient illumination incident on the composite light sensor and the light output by the OLED.

21. The OLED display and photo-sensor claimed in claim 11, wherein the OLED display is an active-matrix display and further including thin-film electronic components for operating the OLEDs in the display.

22. The OLED display and photo-sensor claimed in claim 21, wherein the plurality of thin-film light sensitive elements are formed in common manufacturing steps with the thin-film electronic components.

23. A method of calibrating the composite light sensor of an OLED display and photo-sensor, comprising the steps of:
    a) providing the OLED display and photo-sensor, including:
       i) a substrate;
       ii) a composite light sensor made up of a plurality of individual thin-film light sensitive elements located over the substrate and connected in parallel with electrical connections to provide a common signal:
iii) a first transparent electrode located over the composite light sensor;
iv) one or more organic layers comprising an OLED located on the transparent electrode and emitting light through the transparent electrode and to the composite light sensor;
v) a second electrode located on the one or more organic layers;
b) turning off the OLED;
c) exposing the composite light sensor to a known incident illumination;
d) sensing and measuring the ambient light incident on the composite light sensor; and
e) storing the measured response of the composite light sensor comprising an OLED.

24. A method according to claim 23, further comprising the steps of:
f) tuning on the OLED:
g) sensing and measuring the OLED light incident on the composite light sensor; and
h) correcting the OLED light output by the OLED display.

25. A method according to claim 24, further comprising the steps of:
i) sensing and measuring the combined GLEE) and ambient light incident on the composite light sensor; and
j) subtracting the measured ambient light from the combined light to obtain the light output by the OLED.

* * * * *

UNITED STATES PATENT AND TRADEMARK OFFICE
CERTIFICATE OF CORRECTION

PATENT NO. : 7,288,753 B2  Page 1 of 1
APPLICATION NO. : 10/839616
DATED : October 30, 2007
INVENTOR(S) : Ronald S. Cok It is certified that error appears in the above-identified patent and that said Letters Patent is hereby corrected as shown below:

| | |
|---|---|
| Claim 1, column 7, line 17. | In Claim 1, delete "signal:" and insert --signal;--, therefor. |
| Claim 1, column 7, line 18. | In Claim 1, delete "C)" and insert --c)--, therefor. |
| Claim 9, column 7, line 58. | In Claim 9, delete "thin-him" and insert --thin-film--, therefor. |
| Claim 11, column 8, line 3. | In Claim 11, delete "C)" and insert --c)--, therefor. |
| Claim 23, column 9, line 2. | In Claim 23, delete "signal:" and insert --signal;--, therefor. |
| Claim 24, column 10, line 3. | In Claim 24, delete "tuning" and insert --turning--, therefor. |
| Claim 24, column 10, line 3. | In Claim 24, delete "OLED:" and insert --OLED;--, therefor. |
| Claim 25, column 10, line 11. | In Claim 25, delete "GLEE" and insert --OLED--, therefor. |

Signed and Sealed this

Twenty-ninth Day of April, 2008

JON W. DUDAS
*Director of the United States Patent and Trademark Office*